United States Patent [19]

Homma et al.

[11] Patent Number: 5,420,075
[45] Date of Patent: May 30, 1995

[54] FORMING MULTI-LAYERED INTERCONNECTIONS WITH FLUORINE COMPOUND TREATMENT PERMITTING SELECTIVE DEPOSITION OF INSULATOR

[75] Inventors: Tetsuya Homma; Mieko Suzuki, both of Tokyo, Japan

[73] Assignee: NEC Corporation, Tokyo, Japan

[21] Appl. No.: 45,791

[22] Filed: Apr. 14, 1993

[30] Foreign Application Priority Data

Apr. 15, 1992 [JP] Japan ................................ 4-095117

[51] Int. Cl.6 ............................................. H01L 21/44
[52] U.S. Cl. .................................... 437/195; 437/235; 437/228
[58] Field of Search .............................. 437/195, 228

[56] References Cited

U.S. PATENT DOCUMENTS

| | | | |
|---|---|---|---|
| 4,795,722 | 1/1989 | Welch et al. | 437/195 |
| 4,965,226 | 10/1990 | Gootzen et al. | 437/195 |
| 4,994,402 | 2/1991 | Chiu | 437/195 |
| 5,086,017 | 2/1992 | Lu | 437/228 |
| 5,229,326 | 7/1993 | Dennison et al. | 437/195 |
| 5,266,525 | 11/1993 | Morozumi | 437/195 |
| 5,270,240 | 12/1993 | Lee | 437/195 |
| 5,275,977 | 1/1994 | Otsubo | 437/228 |
| 5,284,549 | 2/1994 | Barnes | 437/195 |
| 5,296,094 | 3/1994 | Shan | 437/228 |
| 5,312,775 | 5/1994 | Fujii | 437/190 |

FOREIGN PATENT DOCUMENTS

| | | |
|---|---|---|
| 2-209753 | 9/1989 | Japan . |
| 4-239750 | 1/1991 | Japan . |
| 4-360533 | 6/1991 | Japan . |

Primary Examiner—Brian E. Hearn
Attorney, Agent, or Firm—Popham, Haik, Schnobrich & Kaufman, Ltd.

[57] ABSTRACT

A method of manufacturing a semiconductor device, incorporates the steps of: performing reactive ion etching using a fluorine compound gas to surface-treat the lower level wirings which permits selective deposition of the second silicon oxide film; selectively depositing a second silicon oxide film between said lower level wirings by a CVD method using an organic silicon compound gas and an oxidizable gas as source gases; depositing a third silicon oxide film on an entire surface and forming through holes connected to the lower wirings; and forming upper level wirings connected to the lower level wirings. Further, an additional silicon oxide film can be deposited on the major surface so as to form a side wall thereof on the lower level wirings. The reactive ion etching is then performed.

14 Claims, 4 Drawing Sheets

FORMING MULTI-LAYERED INTERCONNECTIONS WITH FLUORINE COMPOUND TREATMENT PERMITTING SELECTIVE DEPOSITION OF INSULATOR

BACKGROUND OF THE INVENTION

1. Field of the Invention

The present invention relates to a method of manufacturing a semiconductor device and, more particularly to a method of forming an interlayer dielectric film for multi-layered interconnections.

2. Description of the Prior Art

A method described in Japanese Patent Laid-Open No. Hei 2-209753 will be described with reference to FIGS. 1A to 1D as a method of forming an interlayer dielectric film for conventional multi-layered interconnections.

As shown in FIG. 1A, lower level aluminum wirings $4a$ are formed on a silicon substrate $1a$.

As shown in FIG. 1B, a plasma-enhanced CVD-$SiO_2$ film (hereinafter called PECVD-$SiO_2$ film) $6b$ having a thickness of 0.2 to 0.3 $\mu m$ is formed on the resultant structure. A 2 $\mu m$ thick TEOS-based $SiO_2$ film $7a$ is deposited by an atmospheric pressure CVD (Chemical Vapor Deposition) method using TEOS and ozone at 350° C. (hereinafter called TEOS-Ozone $SiO_2$ film). TEOS is represented by a chemical formula of Si-$(OC_2H_5)_4$ and is called a tetraethylorthosilicate or tetraethoxysilane.

As shown in FIG. 1C, a plasma-enhanced CVD-$SiO_2$ film $8a$ is deposited on the resultant structure again, and a resist 9 is formed and patterned.

As shown in FIG. 1D, the plasma-enhanced CVD-$SiO_2$ film $8a$, the TEOS-Ozone $SiO_2$ film $7a$, and the PECVD-$SiO_2$ film $6b$ are etched using the resist 9 as a mask to form through holes. After upper level aluminum wirings $14a$ are formed, the resultant structure is annealed at 380° C. to properly electrically connect the upper aluminum wirings $14a$ to the lower level aluminum wirings $4a$.

When a lower wiring is formed on the surface of a semiconductor substrate, the substrate surface feature is reflected more or less upon the interlayer dielectric films surface on the lower level wirings by the CVD method. Therefore, it is difficult to planarize the surface of the resultant device by only using the CVD method.

A-wiring metal may be left in the recess during the wirings formation and is short-circuited with the same level wirings. In addition, the upper level wirings are disconnected to form open circuits. Short-circuiting occurs or the open circuit is formed to reduce the product yield.

Step coverage of the upper level wiring becomes poor causing stress migration or electromigration. The upper level wiring tends to be disconnected thereby degrading the reliability of the multi-layered interconnections.

A silicon oxide film deposited by the conventional CVD method using TEOS and ozone has a high moisture content. Moisture is evaporated from the side surface of a through hole to increase a connection resistance during deposition of a metal film serving as the upper level wiring. For this reason, the yield of the multilayered interconnections is reduced and their reliability is degraded.

When a multi-layered interconnection having three or more layers is formed, an absolute step height between a portion having no interconnection and a portion in which interconnections overlap each other is increased. In the manufacturing process of patterning a photo-resist on the semiconductor substrate, the dimensional precision of the resist pattern is thus degraded.

It is therefore difficult to form a micropatterned and multi-layered interconnection.

SUMMARY OF THE INVENTION

The present invention has been made in consideration of the above circumstances, and has for its object to provide a method of manufacturing a semiconductor device, in which a micropatterned and multi-layered interconnection can be formed.

In order to achieve the above object, according to the first aspect of the present invention, there is provided a method of manufacturing a semiconductor device, comprising the steps of: depositing a second silicon oxide film on one major surface of a semiconductor substrate having lower level wirings formed on the first silicon oxide film; performing reactive ion etching using a fluorine compound gas to form a side wall consisting of the second silicon oxide film on the lower level wirings and, at the same time, surface-treat the lower level wirings; selectively depositing a third silicon oxide film between the lower level wirings by a CVD method using an organic silicon compound gas and an oxidizable gas as source gases; depositing a fourth silicon oxide film on an entire surface and forming through holes connected to the lower level wirings; and forming upper level wirings connected to the lower level wirings.

In order to achieve the above object, according to the second aspect of the present invention, there is provided a method of manufacturing a semiconductor device, comprising the steps of: performing reactive ion etching using a fluorine compound gas on one major surface of a semiconductor substrate having lower level wirings formed on a first silicon oxide film, in order to surface treat the lower level wirings; selectively depositing a third silicon oxide film between the lower level wirings by a CVD method using an organic silicon compound gas and an oxidizable gas as source gases; depositing a fourth silicon oxide film on an entire surface and forming through holes connected to the lower level wirings; and forming upper level wirings connected to the lower level wirings.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

The present invention will now be described in detail with reference to several preferred embodiments illustrated in the accompanying drawings.

The first embodiment of the present invention will now be described with reference to FIGS. 2A to 2D and 3A to 3C.

Figure 1A:
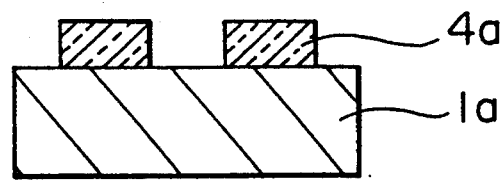
FIGS. 1A to 1D are cross-sectional views showing a conventional method of manufacturing a multilayered interconnection.
Figure 1B:
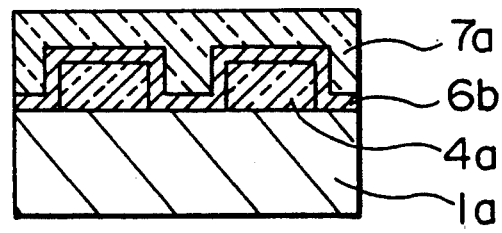
Figure 1C:
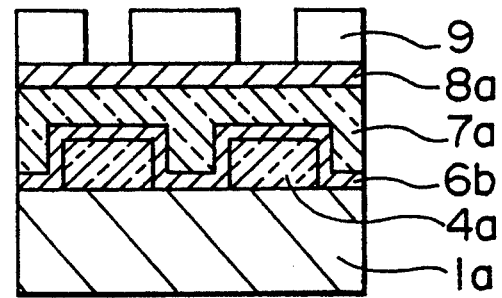
Figure 1D:
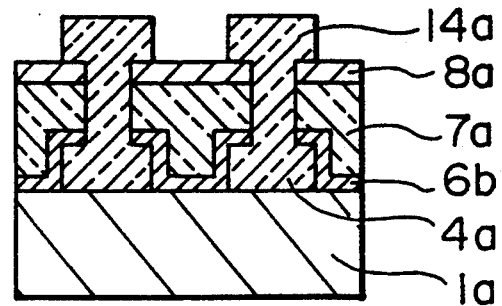
Figure 2A:
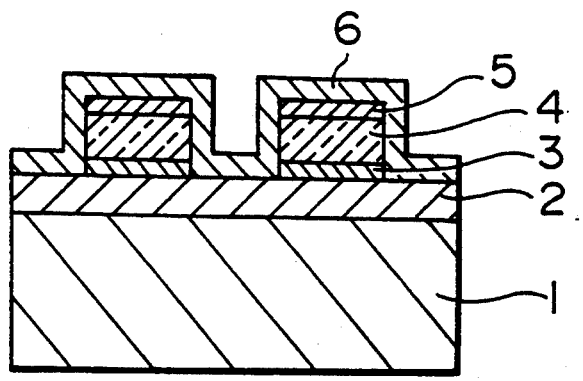
FIGS. 2A to 2D are cross-sectional views showing the first half of the steps in manufacturing a semiconductor device according to the first embodiment of the present invention.

As shown in FIG. 2A, 0.15 $\mu$m thick titanium nitrides, 0.55 $\mu$m thick aluminum-silicon-copper 4, and 0.1 $\mu$m thick titanium-tungstens are sequentially formed on a semiconductor substrate 1 on which a 0.5 $\mu$m thick silicon oxide film 2 is formed. Selective etching is performed using a resist (not shown) as a mask to form lower level wirings.

A 0.3 $\mu$m thick silicon oxide film 6 is formed on the resultant structure by a PECVD method.

Figure 2B:
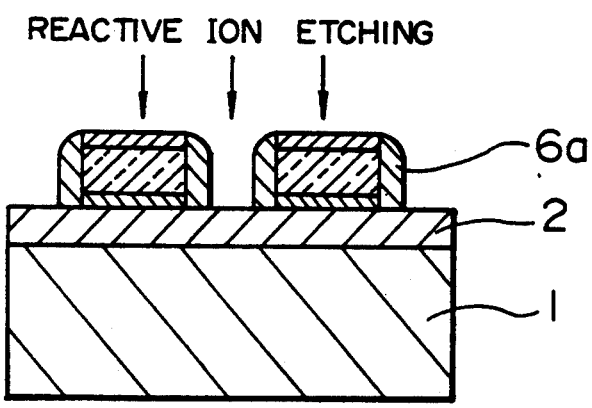

As shown in FIG. 2B, reactive ion etching is performed at the flow rate of CHF, of 30 sccm, a pressure of 5 Pa, and an RF power of 1 kW to perform an etch-back operation until the silicon oxide film 6 on the titanium-tungsten 5 is perfectly removed, thereby forming side walls 6a consisting of the silicon oxide film 6.

The titanium-tungsten 5 exposed by this etch-back operation is also thereby surface-treated. The thickness of the silicon oxide film 6 is preferably ½ or less the minimum spacings between the lower level wirings.

Figure 2C:
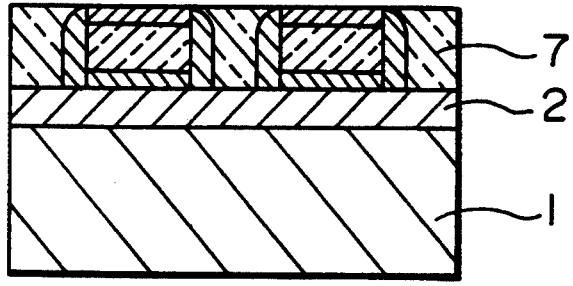

As shown in FIG. 2C, a 0.8 $\mu$m thick silicon oxide film 7 is selectively formed on the exposed silicon oxide film 2 by the atmospheric pressure CVD method using TEOS and ozone.

Figure 2D:
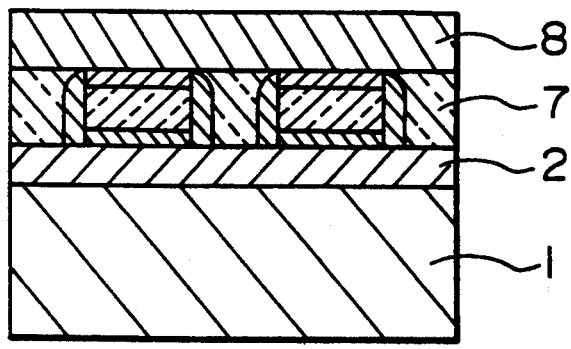

As shown in FIG. 2D, a 0.8 $\mu$m thick silicon oxide film 8 is deposited on the resultant structure by the PECVD method.

Figure 3A:
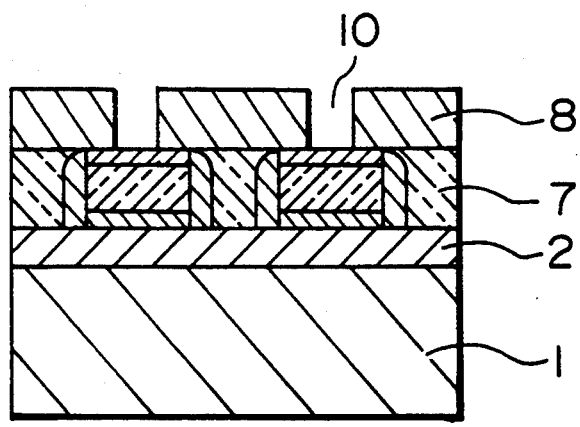
FIGS. 3A to 3C are cross-sectional views showing the second half of the steps in manufacturing the semiconductor device according to the first embodiment of the present invention.

As shown in FIG. 3A, the silicon oxide film 8 is dry-etched using a resist (not shown) as a mask to form through holes 10.

Figure 3B:
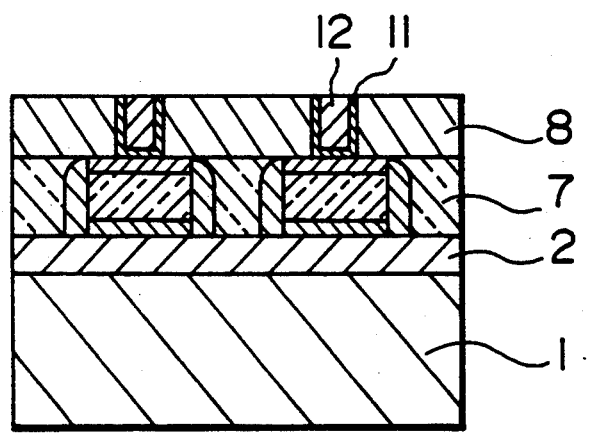

As shown in FIG. 3B, after 0.15 $\mu$m thick titanium nitride 11 is deposited by the sputtering method, tungsten 12 is deposited by the CVD method to bury the through holes 10. Reactive ion etching is performed to etch back the tungsten 12 and the titanium nitride 11 which are formed on the silicon oxide film 8.

Figure 3C:
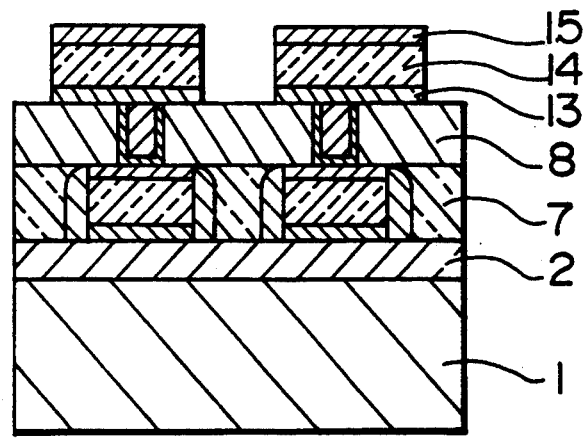

As shown in FIG. 3C, 0.15 $\mu$m thick titanium nitrides, 0.55 $\mu$m thick aluminum-silicon-copper, and 0.1 $\mu$m thick titanium-tungsten 15 are deposited by the sputtering method. The titanium-tungsten 15, the aluminum-silicon-copper 14, and the titanium nitride 13 are etched using a resist (not shown) as a mask to form upper level wirings.

The stress migration endurance of the lower level wiring was examined in a test at 175° C. for 5,000 hours. An open circuit was not detected, and an increase in resistance was not found. Electromigration breakdown at a temperature of 200° C. and a current density of $2\times10^6 A/cm^2$ was examined. A time required to reach a cumulative defective ratio of 50% was prolonged by 10% as compared with the conventional example.

The second embodiment of the present invention will be described with reference to FIGS. 4A to 4D.

Figure 4A:
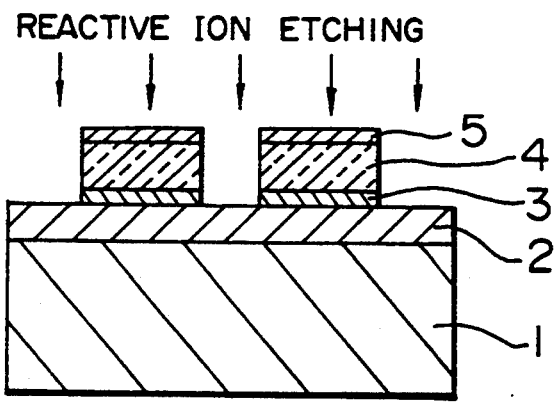
FIGS. 4A to 4D are cross-sectional views showing the steps in manufacturing a semiconductor device according to the second embodiment of the present invention.

As shown in FIG. 4A, a 0.5 $\mu$m thick PECVD-SiO$_2$ film 2, 0.15 $\mu$m thick titanium nitride 3, 0.55 $\mu$m thick aluminum-silicon-copper 4, and 0.1 $\mu$m thick titanium-tungsten 5 are sequentially formed on a semiconductor substrate 1. Etching is performed using a resist (not shown) as a mask to form lower level wirings consisting of the titanium nitride 3, the aluminum-silicon-copper 4, and the titanium-tungsten 5, and then the resist is removed.

Reactive ion etching is performed at a pressure of 5 Pa, flow rates of CHF$_3$ and O$_2$, (oxygen) of 30 sccm and 5 sccm, and an RF power of 1 kW for 2 minutes to surface-treat the titanium-tungsten 5.

Figure 4B:
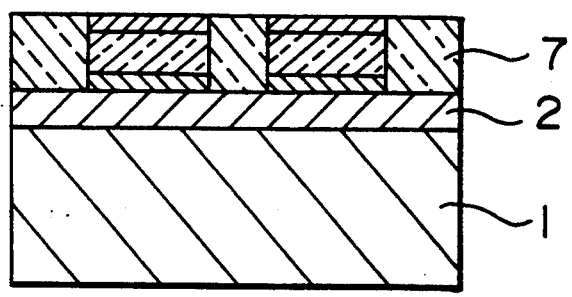

As shown in FIG. 4B, a flow rate ratio of TEOS to ozone is set to 20:1, and an atmospheric pressure CVD method using a substrate temperature of 350° C. is performed to selectively deposit a 0.8 $\mu$m thick silicon oxide film 7 on the exposed silicon oxide film 2. At this time, a siloxane precursor having an Si—O bond is formed by a chemical reaction of TEOS and ozone. A silicon oxide film is not deposited on the titanium-tungsten 5 because the adsorption probability of the siloxane precursors on the surface of the titanium-tungsten 5 is reduced by reactive ion etching using fluorine compound gas.

Figure 4C:
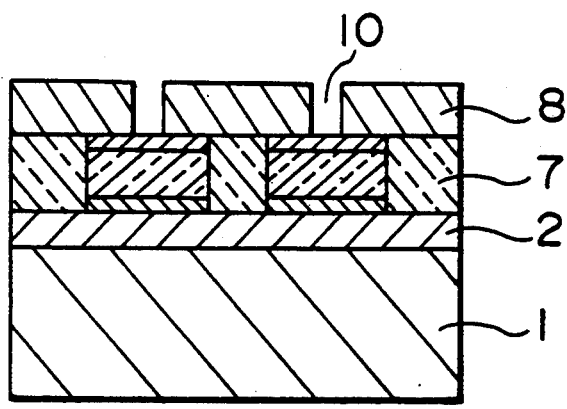

As shown in FIG. 4C, a 0.8 $\mu$m thick silicon oxide film 8 is deposited on the entire surface by the PECVD method, and etching is performed using a resist (not shown) as a mask to form through holes 10.

Figure 4D:
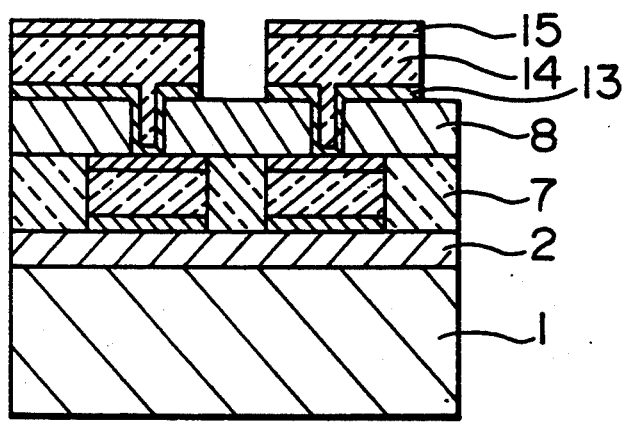

As shown in FIG. 4D, a 0.15 $\mu$m thick titanium nitride 13, 0.55 $\mu$m thick aluminum-silicon-copper 14, and 0.1 $\mu$m thick titanium-tungsten 15 are formed by a sputtering method. Etching is performed using a resist (not shown) as a mask to form upper level wirings consisting of the titanium tungsten 15, the aluminum-silicon-copper 14, and the titanium nitride 13.

The double-layered interconnections thus formed have a perfectly flat interlayer dielectric film, and an open or short circuit is not occurred in the upper level wirings. 500,000 through holes each having a diameter of 0.8 $\mu$m were formed, and connection resistances were measured using series-connected patterns. Good data as a yield of 98% at a resistance of about 0.2 $\Omega$ per through hole could be obtained.

An open or short circuit was not detected in the upper level wirings in the second embodiment. 500,000 through holes each having a diameter of 0.8 $\mu$m were formed, and connection resistances were measured using series-connected patterns. Good data as a yield of 98% at a resistance of about 0.25 $\mu\Omega$ per through hole could be obtained.

Good data as in the first embodiment could be obtained for the stress migration breakdown and electromigration breakdown of the lower level wirings.

The third embodiment of the present invention will be described below.

In this embodiment, the step of depositing the silicon oxide film 7 (FIG. 4A) of the second embodiment is changed in accordance with methods used in Japanese Patent Application Laid-Open Nos. Hei 4-239750 and Hei 4-60533, and the contents thereof will be described below.

50° C. fluorotriethoxysilane and 50° C. distilled water are evaporated using a carrier gas as N$_2$ (nitrogen) at flow rates of 100 sccm and 75 sccm, respectively. A substrate is placed in a CVD reaction chamber at a pressure of 700 Torr. A fluorine-containing silicon oxide film is selectively deposited on the exposed silicon film at a substrate temperature of 25° C.

As shown in FIG. 4A, titanium nitride 3, aluminum-silicon-copper 4, and titanium-tungsten 5 are deposited by the sputtering method on a semiconductor substrate 1 on which a silicon oxide film 2 is formed. Etching is performed using a resist (not shown) as a mask to form lower level wirings, and then the resist is removed. Reactive ion etching using $SF_6$ (sulfur hexafluoride) is performed to surface-treat the titanium-tungsten 5.

As shown in FIG. 4B, a fluorine-containing silicon oxide film 7 is formed on the exposed silicon oxide film 2 in accordance with an sub-atmospheric pressure CVD method using fluorotriethoxysilane and water vapor.

Upper level wirings are formed following the same steps as in the second embodiment, and the characteristics of the resultant semiconductor device were evaluated. The same good data as in the previous embodiments can be obtained in the third embodiment in which the fluorine-containing silicon oxide film is selectively deposited.

In this embodiment, each of the upper and lower level wirings is constituted by a three-layered structure consisting of titanium nitride, aluminum-silicon-copper, and titanium-tungsten. In place of these materials, at least one of aluminum, an aluminum alloy (e.g., aluminum-silicon-copper), polysilicon, gold, titanium, tungsten, molybdenum, and titanium-tungsten (a single layer or multilayer) can be used.

A silicon oxide film formed by a sputtering method, a thermal CVD method, a photochemical CVD method, or a liquid-phase deposition method can be used in place of the plasma CVD-$SiO_2$ film.

A fluorocarbon compound or a sulfur fluoride compound may be used in place of $CHF_3$ and $SF_6$ as a fluorine compound gas to surface-treat the lower level wirings by reactive ion etching.

The method of selectively depositing the silicon oxide film by the atmospheric pressure CVD method can be modified as follows. A silicon oxide film can be selectively deposited by an atmospheric pressure CVD method, a high-pressure CVD method using at least one of organic siloxane, organic silane and fluoroalkoxysilane, and at least one of ozone, oxygen, nitrous oxide vapor or a liquid-phase deposition method.

The present invention is not limited to a double-layered interconnection, but is applicable to a multi-layered interconnection consisting of three or more wiring layers.

As can be apparent from the above description, according to the present invention, the semiconductor substrate surface having lower level wirings is etched by reactive ion etching using a fluorine compound gas to reduce the adsorption probability of the siloxane precursors on the surfaces of the lower level wirings. A silicon oxide film can be selectively deposited on a silicon oxide film exposed between the lower level wirings.

A perfectly flat interlayer dielectric film can be formed. Formation of a multi-layered interconnection can be facilitated. The short and open circuits of the upper level wirings can be prevented to increase the product yield.

The breakdown of the lower level wirings against the stress migration and electromigration can be improved to greatly improve the reliability.

The silicon oxide film deposited by the atmospheric pressure CVD method using TEOS and ozone is not exposed on the side surface of each through hole. An increase in connecting resistance between the lower and upper level wirings in each through hole can be prevented. A highly reliable semiconductor device can be manufactured at a high yield.

The surface of the semiconductor substrate can be planarized, and a resist pattern having high dimensional precision can be easily formed accordingly. As a result, micropatterned multi-layered interconnections can be formed according to the present invention.

What is claimed is:

1. A method of manufacturing a semiconductor device, comprising the steps of: depositing a second silicon oxide film on a semiconductor substrate which has lower level wirings formed on a first silicon oxide film on said substrate; performing reactive ion etching using a fluorine compound gas to form a side wall consisting of said second silicon oxide film on said lower level wirings and at the same time to surface-treat said lower level wirings; selectively depositing a third silicon oxide film between said lower level wirings by a CVD method using an organic silicon compound gas and an oxidizable gas as source gases; depositing a fourth silicon oxide film on an entire surface of the semiconductor device and forming through-holes through said fourth silicon oxide film to said lower level wirings, forming conductive connections in said through-holes to said lower level wirings, and forming upper level wirings on said fourth silicon oxide film and connected to said conductive connections to connect to said lower level wirings.

2. A method of manufacturing a semiconductor device, comprising the steps of: performing reactive ion etching using a fluorine compound gas on one major surface of a semiconductor substrate having lower level wirings formed on a first silicon oxide film to surface-treat said lower level wirings; selectively depositing a second silicon oxide film between said lower level wirings by a CVD method using an organic silicon compound gas and an oxidizable gas as source gases; depositing a third silicon oxide film on an entire surface of the semiconductor device and forming through-holes through said third silicon oxide film to said lower level wirings; and forming upper level wirings in said through-holes and on said third silicon oxide film to connect to said lower level wirings.

3. A method according to claim 1, wherein each of said lower and upper level wirings has a single-layer or multi-layered structure consisting of at least one material selected from the group consisting of aluminum, an aluminum alloy, polysilicon, gold, titanium, tungsten, molybdenum, titanium-tungsten, and metal silicides.

4. A method according to claim 1, wherein said first, second, and fourth silicon oxide films are deposited by at least one of a sputtering method, a thermal CVD method, a plasma-enhanced CVD method, a photo-assisted CVD method, and a liquid-phase deposition method.

5. A method according to claim 1, wherein the fluorine compound gas is at least one gas selected from the group consisting of a fluorocarbon compound and a sulfur fluoride compound.

6. A method according to claim 1, wherein the organic silicon compound is one of organic siloxane and organic silane.

7. A method according to claim 1, wherein the oxidizable gas is at least one gas selected from the group consisting of ozone, oxygen, nitrous oxide, and water vapor.

8. A method according to claim 1, wherein the CVD method using the organic silicon compound and the oxidizable gas as the source gases is one of an atmospheric pressure CVD method, a high-pressure CVD method, and a low-pressure CVD method.

9. A method according to claim 2, wherein each of said lower and upper level wirings has a single-layer or multi-layered structure consisting of at least one material selected from the group consisting of aluminum, an aluminum alloy, polysilicon, gold, titanium, tungsten, molybdenum, titanium-tungsten, and metal silicides.

10. A method according to claim 2, wherein said first second, and third silicon oxide films are deposited by at least one of a sputtering method, a thermal CVD method, a plasma-enhanced CVD method, a photo-assisted CVD method, and a liquid-phase deposition method.

11. A method according to claim 2, wherein the fluorine compound gas is at least one gas selected from the group consisting of a fluorocarbon compound and a sulfur fluoride compound.

12. A method according to claim 2, wherein the organic silicon compound is one of organic siloxane and organic silane.

13. A method according to claim 2, wherein the oxidizable gas is at least one gas selected from the group consisting of ozone, oxygen, nitrous oxide, and water vapor.

14. A method according to claim 2, wherein the CVD method using the organic silicon compound and the oxidizable gas as the source gases is one of an atmospheric pressure CVD method, a high-pressure CVD method, and a low-pressure CVD method.

* * * * *